(12) United States Patent
Ali et al.

(10) Patent No.: US 12,513,974 B2
(45) Date of Patent: Dec. 30, 2025

(54) REDUCED SILICON DISLOCATION DEFECTS FROM DEEP SI TRENCH INTEGRATION

(71) Applicant: TEXAS INSTRUMENTS INCORPORATED, Dallas, TX (US)

(72) Inventors: Abbas Ali, Plano, TX (US); Rajni J. Aggarwal, Garland, TX (US); Steven J Adler, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 135 days.

(21) Appl. No.: 18/148,719

(22) Filed: Dec. 30, 2022

(65) Prior Publication Data

US 2023/0298946 A1 Sep. 21, 2023

Related U.S. Application Data

(60) Provisional application No. 63/320,322, filed on Mar. 16, 2022.

(51) Int. Cl.
| | | |
|---|---|---|
| *H10D 84/03* | (2025.01) | |
| *H01L 21/763* | (2006.01) | |
| *H10D 10/01* | (2025.01) | |
| *H10D 84/01* | (2025.01) | |
| *H10D 84/40* | (2025.01) | |

(52) U.S. Cl.
CPC ......... *H10D 84/038* (2025.01); *H01L 21/763* (2013.01); *H10D 10/021* (2025.01); *H10D 84/0109* (2025.01); *H10D 84/401* (2025.01)

(58) Field of Classification Search
CPC .......... H10D 12/411–491; H10D 12/031–038; H10D 84/619; H10D 84/409; H10D 62/134; H10D 62/184; H10D 10/061; H01L 21/02433
See application file for complete search history.

(56) References Cited

U.S. PATENT DOCUMENTS

| | | | |
|---|---|---|---|
| 2004/0135141 A1* | 7/2004 | Pequignot | H10D 89/611 257/46 |
| 2007/0069255 A1* | 3/2007 | Kim | H10D 64/027 257/E21.654 |
| 2013/0277753 A1* | 10/2013 | Clark, Jr. | H10D 86/01 438/234 |
| 2015/0279696 A1* | 10/2015 | Cohen | H01L 21/31144 257/506 |
| 2015/0287716 A1* | 10/2015 | Babcock | H10D 62/115 438/327 |

* cited by examiner

*Primary Examiner* — Christine S. Kim
*Assistant Examiner* — Cole Leon Lindsey
(74) *Attorney, Agent, or Firm* — Andrew R. Ralston; Frank D. Cimino (57) ABSTRACT

An integrated circuit includes a bipolar transistor extending into a [100] surface of a semiconductor substrate having a crystalline lattice. A deep trench surrounds the bipolar transistor and has a path having a plurality of sides. At least one side extends in a direction parallel to a <100> axis of the crystalline lattice.

20 Claims, 13 Drawing Sheets

REDUCED SILICON DISLOCATION DEFECTS FROM DEEP SI TRENCH INTEGRATION

CROSS-REFERENCE TO RELATED APPLICATIONS

This application claims the benefit of U.S. Provisional Application Ser. No. 63/320,322, filed Mar. 16, 2022, which is incorporated by reference herein in its entirety.

FIELD

This disclosure relates to the field of semiconductor manufacturing, and more particularly, but not exclusively, to reducing defects due to substrate dislocations semiconductor devices.

BACKGROUND

Deep trenches may be formed in semiconductor wafers as device isolation, junction isolation and/or substrate connection structures. In such uses, a deep trench ring may surround an active area in which one or more active devices such as transistors are located.

SUMMARY

The inventors disclose various devices and methods related to integrated circuits that may favorably reduce current leakage of transistors surrounded by an isolation trench formed in a semiconductor substrate.

In one example an integrated circuit includes a bipolar transistor extending into a [100] surface of a semiconductor substrate having a crystalline lattice. A deep trench surrounds the bipolar transistor and has a path having a plurality of sides. At least one side extends in a direction parallel to a <100> axis of the crystalline lattice.

Other examples include methods of manufacturing integrated circuit devices according to the integrated circuit described above.

DETAILED DESCRIPTION

The present disclosure is described with reference to the attached figures. The figures are not necessarily drawn to scale, and they are provided without implied limitation to illustrate various described examples. Several aspects of the disclosure are described below with reference to example applications for illustration. It should be understood that numerous specific details, relationships, and methods are set forth to provide an understanding of the disclosure. The present disclosure is not limited by the illustrated ordering of acts or events unless stated otherwise, as some acts may occur in different orders and/or concurrently with other acts or events. Furthermore, all illustrated acts or events may not be required to implement a methodology in accordance with the present disclosure.

Various disclosed methods and devices of the present disclosure may be beneficially applied to integrated circuits by reducing dislocation defects associated with deep trench features proximate to bipolar or MOS transistors. While such examples may be expected to improve performance of such circuits, e.g. by reducing leakage current or other poor device characteristics, no particular result is a requirement of the present invention unless explicitly recited in a particular claim.

Figure 1A:
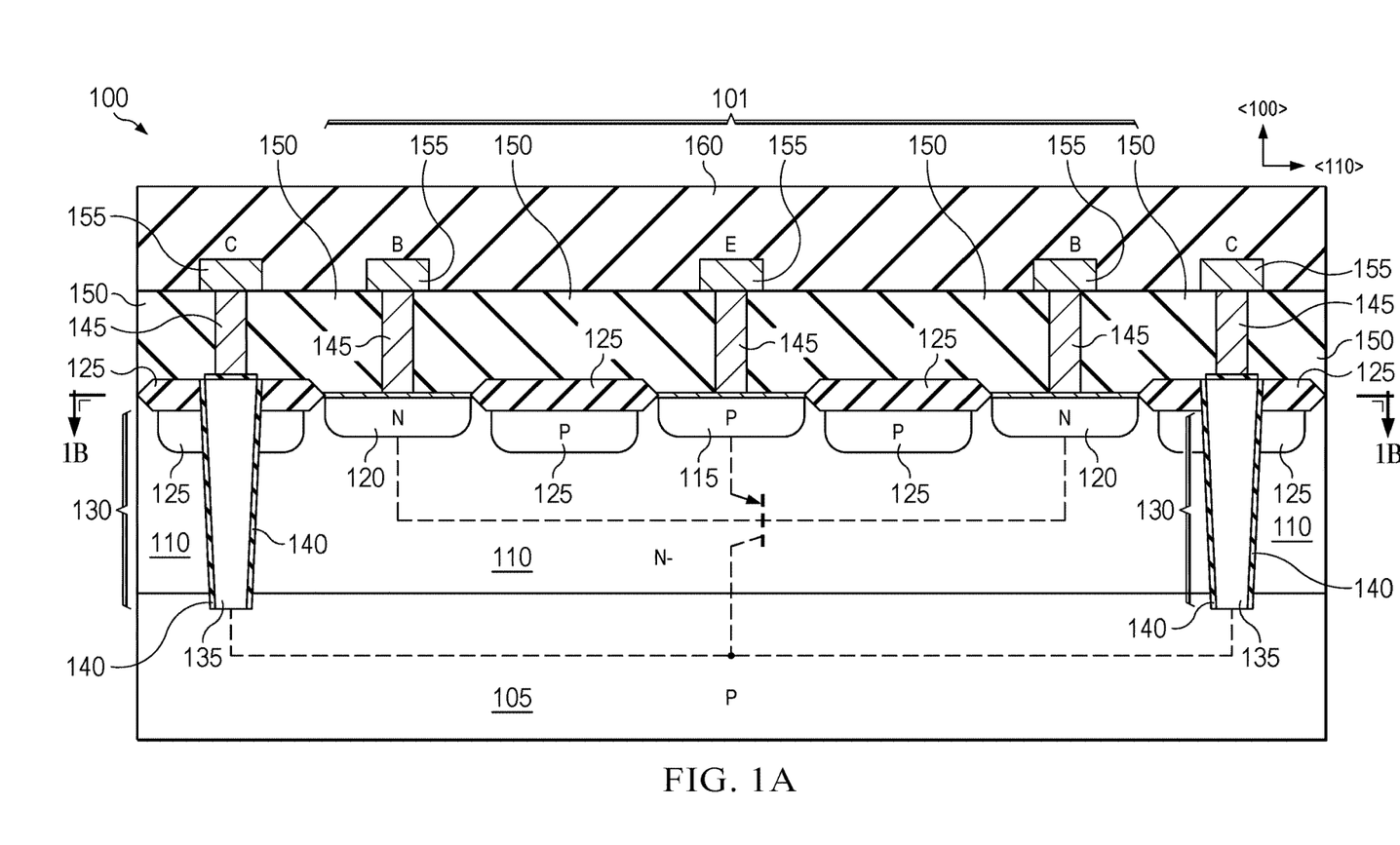
FIGS. 1A and 1B illustrate a baseline bipolar transistor in section view (FIG. 1A) and plan view (FIG. 1B) and relationships with various crystal lattice directions of a substrate in which the transistor is formed.

FIG. 1A illustrates a section view of an integrated circuit (IC) 100 according to various examples. The IC 100 includes a semiconductor layer 105, e.g. a p-type silicon substrate or buried layer. The layer 105, which can be a portion of a semiconductor production substrate (such as a wafer), or a layer formed over a production substrate, may be moderately doped, e.g. 1E18-1E19 cm$^{-3}$. An epitaxial layer 110, e.g. n-type, overlies the layer 105 and may be lightly doped, e.g. 1E17-1E18 cm$^{-3}$. An axis graphic illustrates lattice directions in the layer 105 and epitaxial layer 110, with a first <110> direction oriented horizontally in the plane of the figure, and a <100> direction oriented vertically in the plane of the figure. Various features over or extending into the epitaxial layer 110 implement a PNP bipolar transistor 101. An emitter of the transistor 101 is implemented by a p-type region 115, and a base of the transistor 101 is implemented by n-type regions 120 in cooperation with the n-type epitaxial layer 110. A collector of the transistor 101 is implemented by the layer 105. Dielectric isolation structures 125, e.g. shallow trench isolation or local oxidation of silicon (LOCOS) and P-type channel-stop regions 125 are located between the p-type region (emitter) 115 and each of the n-type regions 120 (base), e.g. to suppress parasitic behavior in the transistor 101.

Deep trench (DT) contacts 130 extend through two of the isolation structures 125. The DT contacts 130 include a polysilicon core 135, or trench contact, and dielectric sidewall insulation 140. The cores 135 may be doped p-type and make electrical contact to the layer 105. Unreferenced silicide layers cover the regions 115, 120 and the cores 135. Contacts 145, or vertical interconnects, extend vertically from the silicide layers through a dielectric layer 150, e.g. a pre-metal dielectric (PMD) layer. Horizontal interconnects 155, or metal lines, connect the contacts 145 to other devices in the IC 100. An inter-level dielectric (ILD) 160 covers the interconnects 155.

Dashed lines illustrate the realization of the PNP bipolar transistor 101, in which the layer 105 implements the collector. Such a transistor may be referred to as a "substrate PNP" transistor. The transistor 101 is presented as one non-limiting example of a bipolar transistor that may be used to illustrate principles of the disclosure. Such principles may be applied to any bipolar or MOS transistor that includes deep trenches such as those that implement the DT contacts 130. A second <100> direction is oriented normal to the first <110> direction and the <100> direction, perpendicular to the plane of the figure. These lattice directions are consistent with a wafer on which the IC 100 is formed having an orientation notch at the <110> position. Such a wafer, or substrate, may be referred to as a "<110> substrate".

Herein, a "deep trench" is an elongated opening in the semiconductor substrate having one or more of an aspect ratio (depth of the opening divided by the width between sidewalls of the opening at the substrate surface) of at least 5, and may be 10 or 20, and a depth of at least 1 μm, and may be 5-10 μm. Deep trenches are contrasted with shallow trenches, which may have a depth of 300 nm to 500 nm, and an aspect ratio less than or near unity, e.g. 0.25 to 3. A deep trench may be filled by other non-substrate materials, e.g. a dielectric liner and/or doped or undoped polysilicon.

Figure 1B:
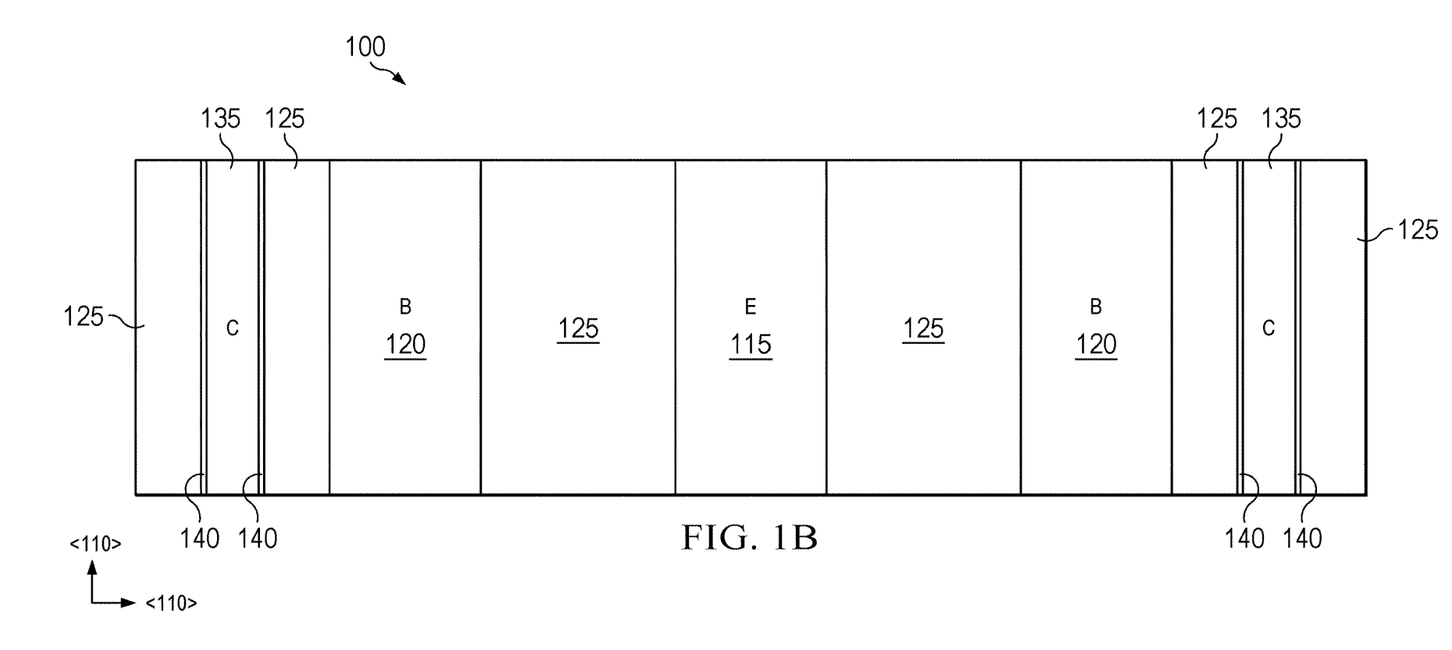

FIG. 1B illustrates a plan, or top, view of the transistor 101 at the level of the top surface of the regions 115, 120. An axis graphic illustrates lattice directions in this view with the first <110> direction oriented horizontally in the plane of the figure, and the second <110> direction oriented vertically in the plane of the figure. The emitter region 115 is labeled "E", the base regions 120 are labeled "B" and the trench contacts 135 are labeled "C". The emitter region 115, the base regions 120 and the trench contacts 135 are implemented as parallel strips with long axes oriented along the vertical <110> lattice direction.

Figure 1C:
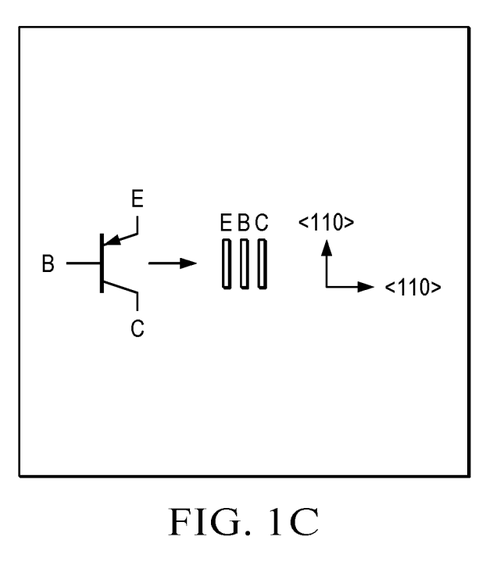
FIG. 1C illustrates a representation of a bipolar transistor as illustrated in various other figures.
Figure 2A:
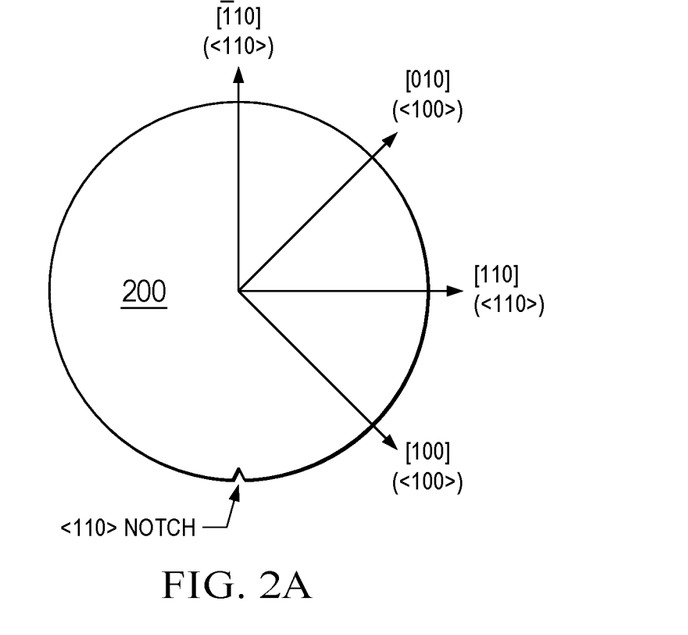
FIG. 2A illustrates various lattice directions on a semiconductor wafer oriented with a reference notch at a <110> position

FIG. 1C illustrates a graphic used in further illustrations below, in which a bipolar transistor is represented as three parallel strips for an emitter strip, a base strip, and a collector strip, which in the illustrations of the transistor 101 are oriented along the <110> lattice direction. The emitter strip, base strip and collector strip may be collectively referred to as "EBC strips" for brevity FIG. 2A illustrates aspects of a production <110> substrate 200, or wafer, as in some baseline implementations. A notch in the six-o'clock position provides a reference for orientation purposes in various process tools, e.g. lithographic tools, that implement a process for which orientation relative to the lattice directions of the substrate 200 may be important. Four lattice directions in the plane of the substrate 200 are shown, [100], [110], [010] and [$\bar{1}$10]. Those skilled in the pertinent art will appreciate that in accordance with common nomenclature, a specific lattice direction is expressed using square brackets, e.g. [$n_1$ $n_2$ $n_3$], and equivalent lattice directions are expressed collectively using angle brackets, e.g. <$n_1$ $n_2$ $n_3$>. Thus, as parenthetically noted in FIG. 2A, the [100] and [010] lattice directions are members of the <100> set of equivalent lattice directions, and the [110] and [$\bar{1}$10] lattice directions are members of the <110> set of equivalent lattice directions. In the discussion that continues below, lattice directions will be referred to by the equivalent lattice direction unless clarity is served by referring to a specific lattice direction. Further, the word "direction" may be used in place of the phrase "lattice direction" where no lack of clarity results. Similarly, a specific lattice plane is designated [h k l], and a family of equivalent planes is shown as {h k l}.

With continuing reference to FIG. 2A, the [$\bar{1}$10] direction is rotated 90° with respect to the [110] direction, and the [010] direction is rotated 90° with respect to the [100] direction. The [110] and [$\bar{1}$10] directions are respectively rotated 45° with respect to the [100] and [010] directions.

Figure 2B:
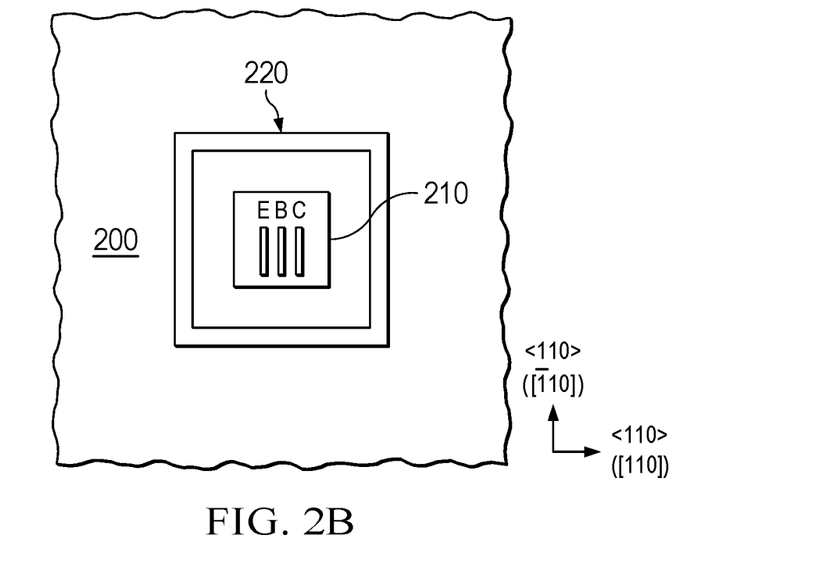
FIG. 2B illustrates a bipolar transistor oriented on a semiconductor wafer such as that illustrated in FIG. 2A.

Referring to FIG. 2B, a baseline transistor 210 is oriented such that the EBC strips are oriented parallel to a <110> direction of the substrate 200, specifically the [$\bar{1}$10] direction in the frame of reference of FIG. 2A. The transistor 210 is surrounded by a deep trench 220. In the example of the transistor 101, the deep trench 220 is the trench within which the DT contacts 130 are formed. In some other transistor configurations, the deep trench 220 may be a component of an isolation structure that surrounds the EBC strips. Regardless, the deep trench 220 has four sides, each of which extends along a <110> direction, specifically the [110] and [$\bar{1}$10] directions in the current example.

Figure 3A:
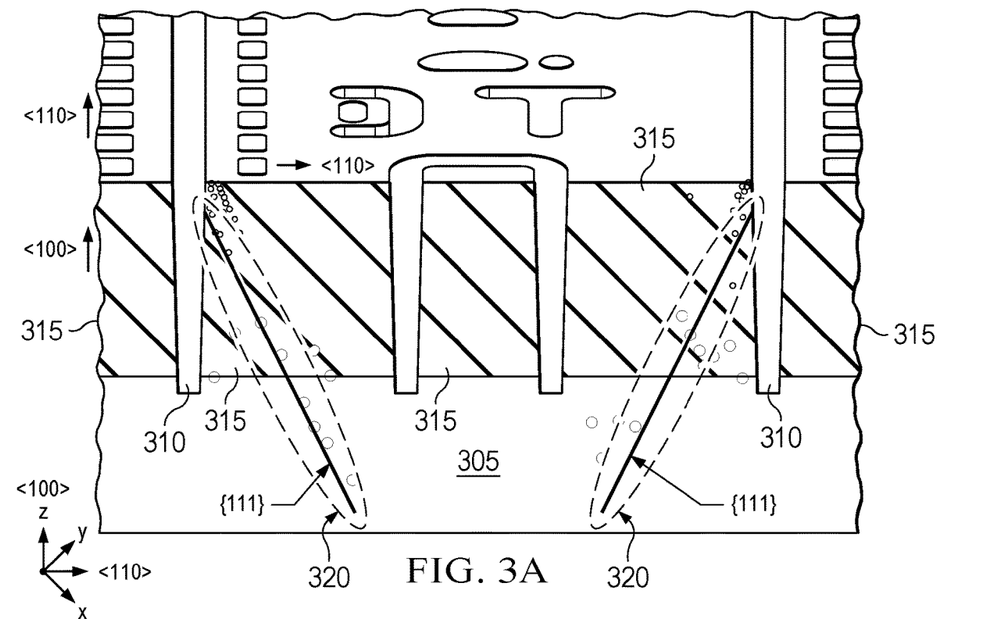
FIGS. 3A and 3B show a test structure with decorated dislocation defects related to deep isolation trenches.
Figure 3B:
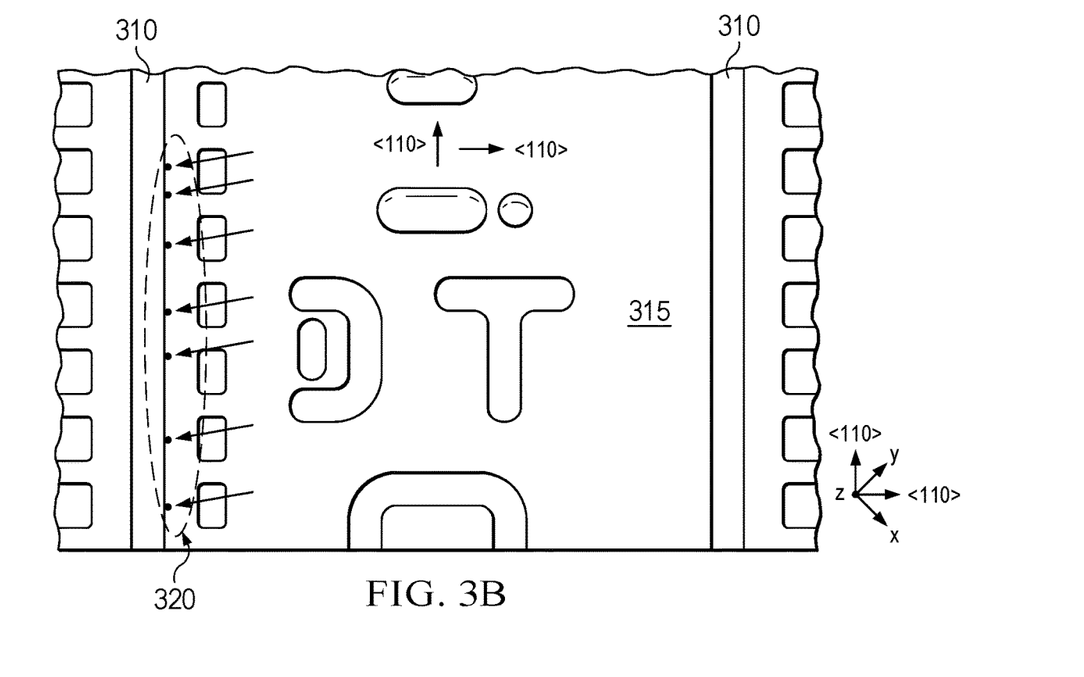

Referring to FIGS. 3A and 3B, respectively shown are a cross-section view and a top view of a substrate 305 with two deep trenches 310 in a silicon layer 315. These line drawings are adapted from micrographs for clarity of presentation. The substrate 305 is a <110> substrate, and the trenches 310 are oriented such that their long axes are parallel to a <110> direction of the substrate 305. The silicon layer 315 was chemically treated to make dislocation defects 320 visible. The dislocation defects 320 a generally clustered along a {111} plane that intersects one of the deep trenches 310 or intersects the top surface of the silicon layer 315 near one of the deep trenches 310.

Figure 4A:
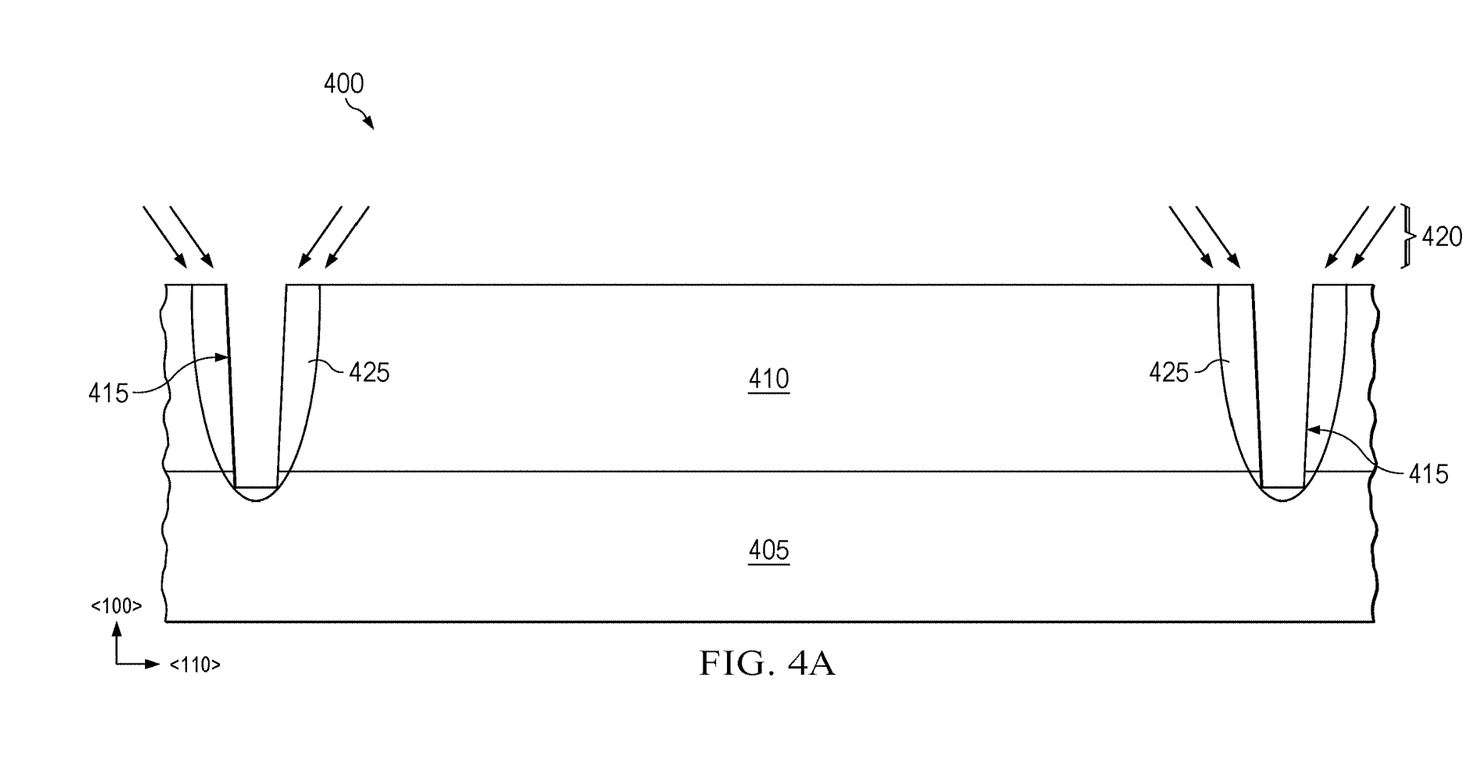
FIGS. 4A-4D illustrate a bipolar transistor at various stages of manufacturing, and illustrating dislocation planes associated with deep isolation trenches.
Figure 4B:
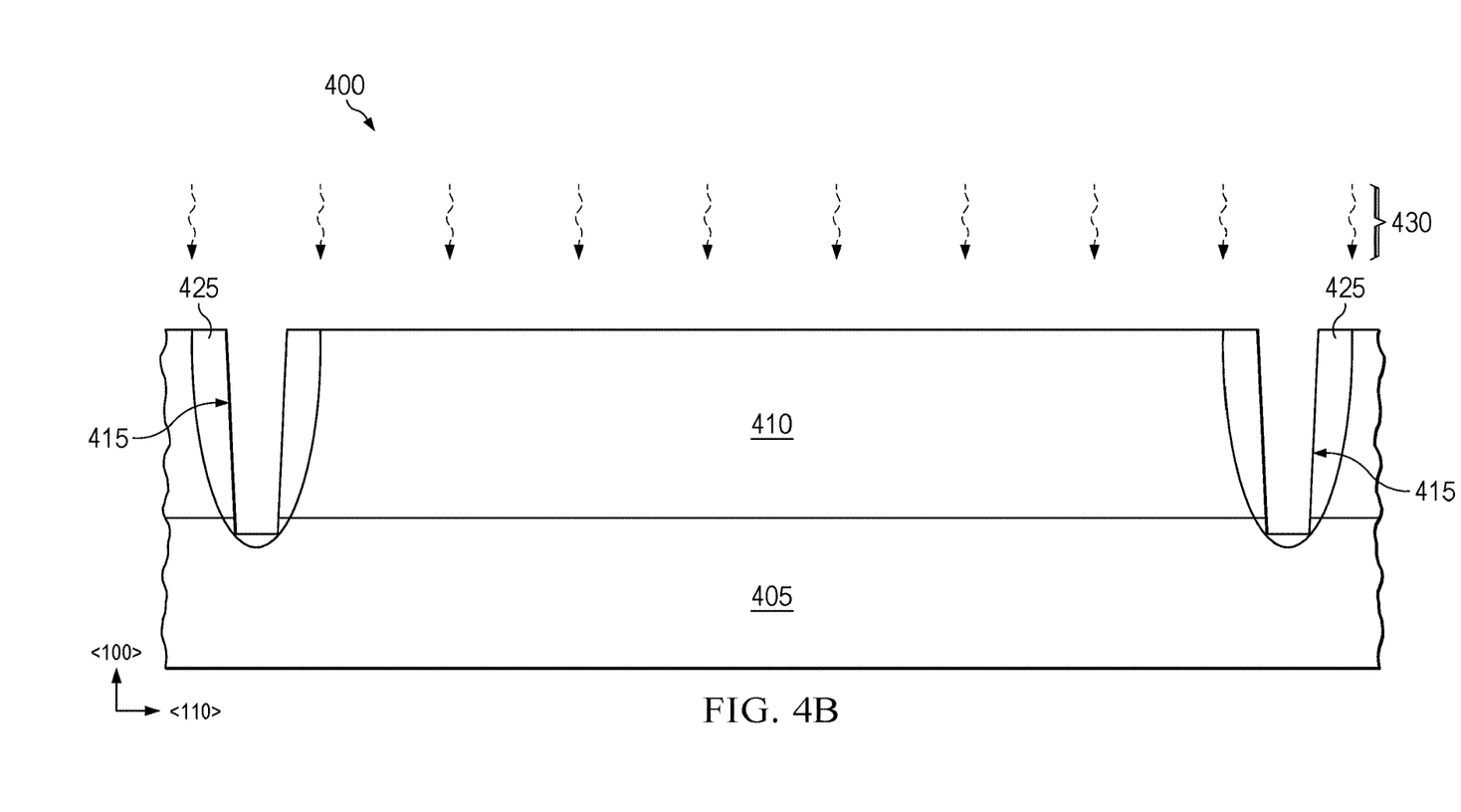
Figure 4C:
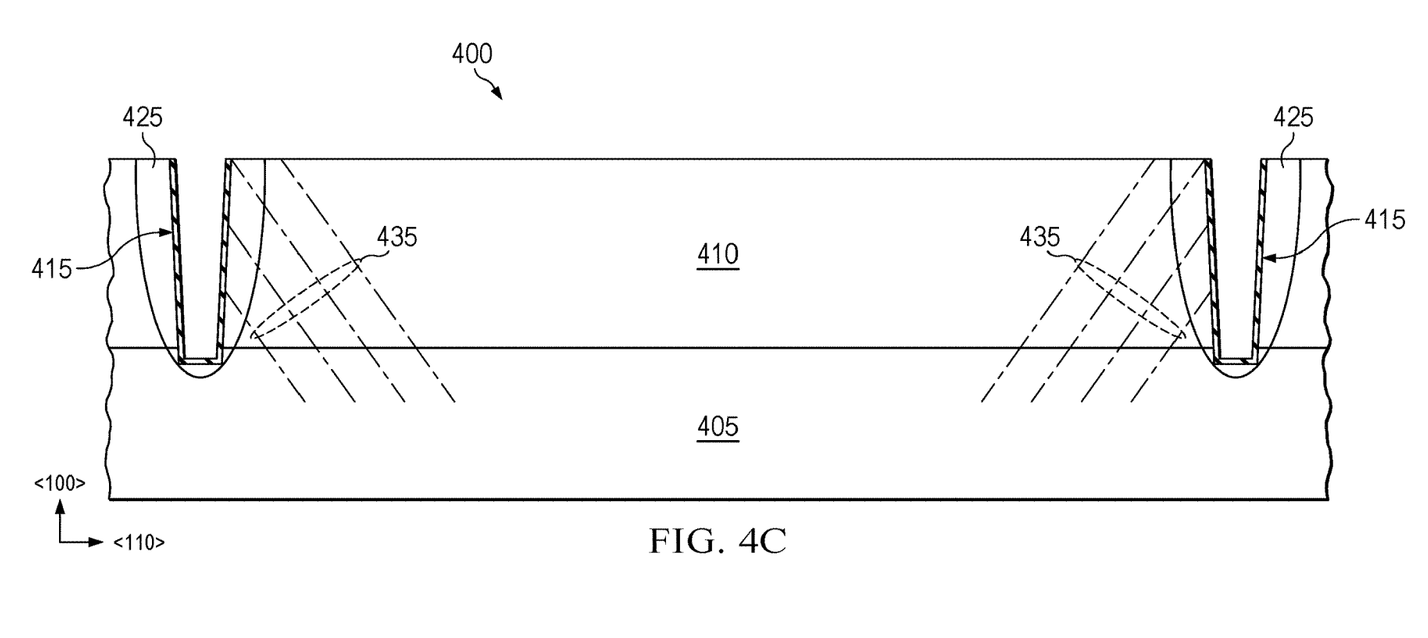
Figure 4D:
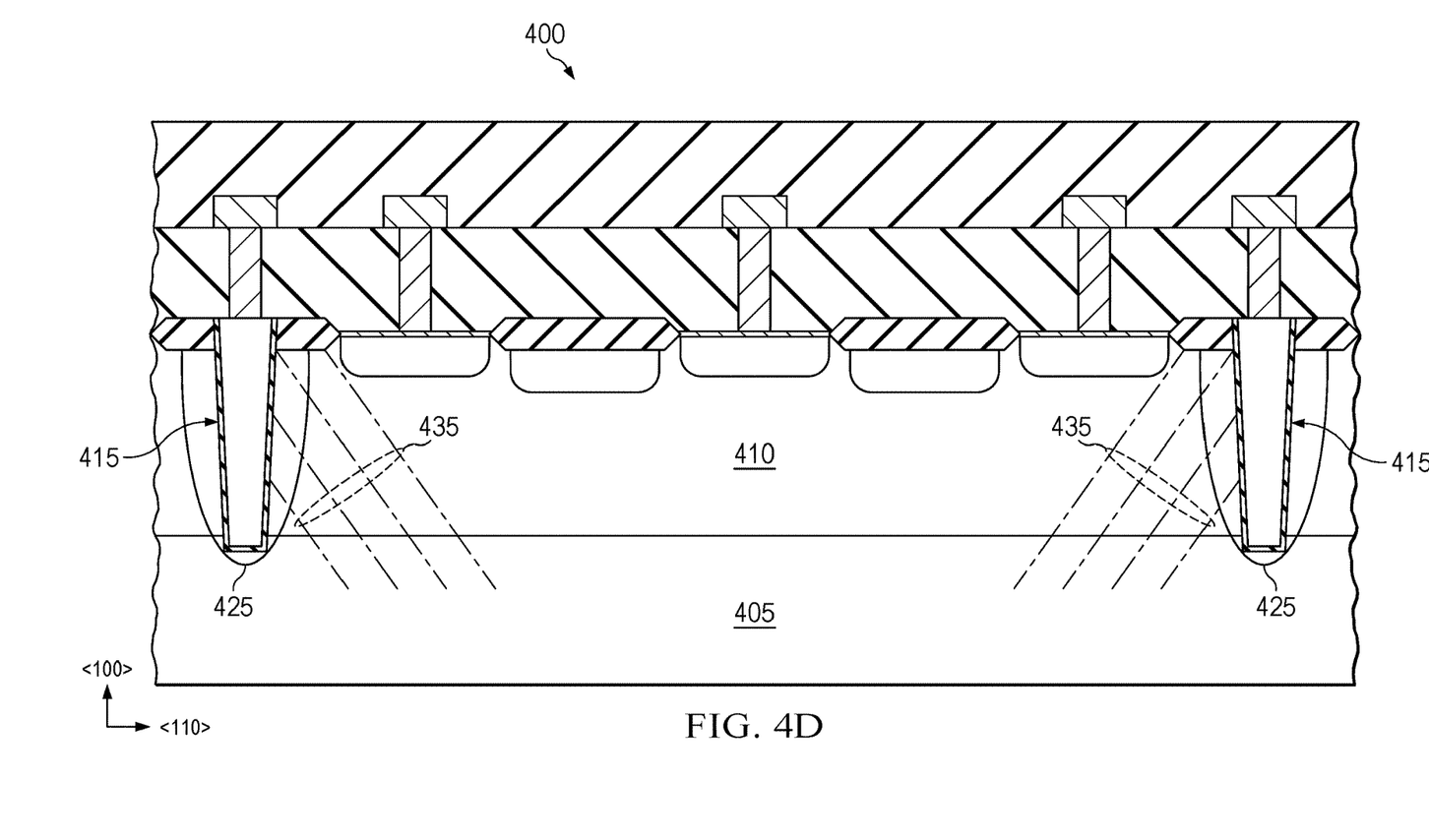

FIGS. 4A-4D show various stages of manufacturing of an integrated circuit 400, illustrating one example of the formation of dislocation defects such as those seen in FIGS. 3A and 3B. In FIG. 4A, deep trenches 415 have been formed in a silicon layer 410 over a <110> substrate 405. A sidewall implant process 420 forms doped regions 425 around the deep trenches 415. In FIG. 4B a thermal process 430, e.g. an activation anneal or oxidation, heats the silicon layer 410, causing strain in the lattice. FIG. 4C shows the integrated circuit 400 after the thermal process 430, including unreferenced sidewall oxide liners in the deep trenches 415. Dislocation defects 435 form due to the lattice strain and generally follow a {111} plane of the silicon lattice. FIG. 4D illustrates the integrated circuit 400 after completion of additional manufacturing steps that form various doped regions and interconnect layers such as those shown in FIG. 1A. The presence of the dislocation defects 435 may result in transistor current leakage or other undesirable characteristics of the integrated circuit 400.

Production substrates with a <110> orientation have been used extensively for MOS transistors to increase hole mobility in the channel. While this principle is generally inapplicable to bipolar transistors, <110> wafers are the de facto standard in most modern semiconductor manufacturing facilities for integrated circuits employing MOS transistors. The inventors have discovered that dislocation defects can be substantially reduced or eliminated by orienting the deep trenches along a lattice direction other than a <110> direction. Thus where the mobility benefit of <110> silicon is not needed, integrated circuits using bipolar transistors isolated by deep trenches may be advantageously formed on <100> silicon wafers, thereby reducing or eliminating dislocation defects that may adversely affect the performance of the bipolar or other transistors.

Figure 5A:
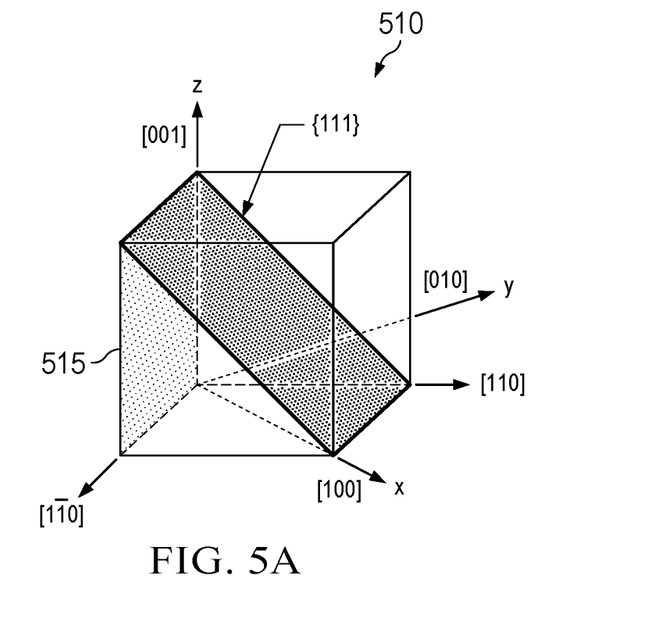
FIG. 5A illustrates a unit cell of a crystal lattice, with an orientation consistent with a <110> production substrate.
Figure 5B:
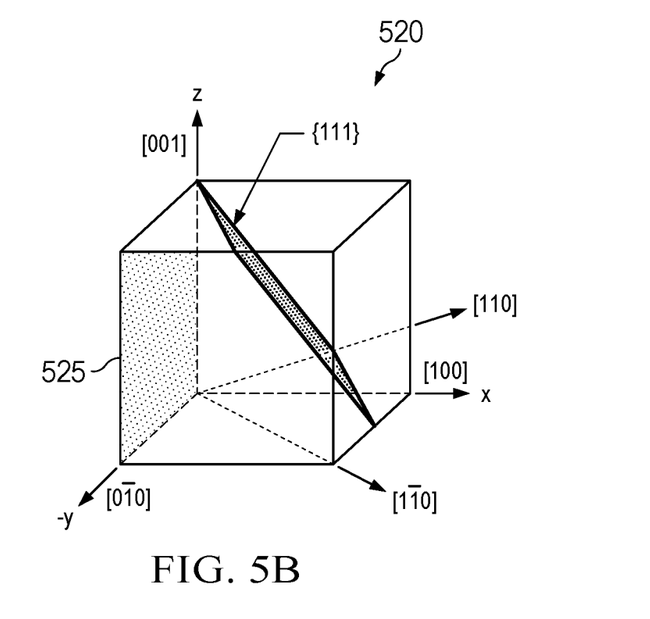
FIG. 5B illustrates a unit cell of a crystal lattice, with an orientation consistent with a <100> production substrate.

This recognition is further illustrated by FIGS. 5A and 5B. FIG. 5A shows a {111} lattice plane in relation to various lattice directions of a cubic unit cell 510. In particular the {111} plane intersects the [1$\bar{1}$0] axis of the illustrated cubic cell, forming an edge with cube face 515. It is believed that stress related to a deep trench having a sidewall parallel to the cube face 515 may cause a portion of the lattice above the {111} plane to slip with respect to a portion below the {111} plane. FIG. 5B illustrates the {111} plane in relation to a cubic unit cell 520 that is rotated 45° with respect to the <110> directions, such that edges of the cubic cell lie along <100> directions. The {111} does not form an edge with cube face 525. Thus stress related to a deep trench having a sidewall parallel to the cube face 525 does not activate slip along the {111} plane, and the dislocation defects are not formed.

Figure 6A:
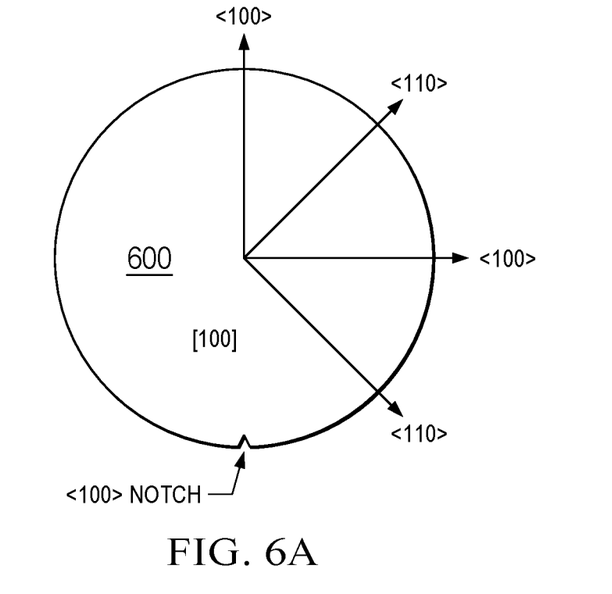
FIG. 6A illustrates a <100> production substrate with representative lattice directions.
Figure 6B:
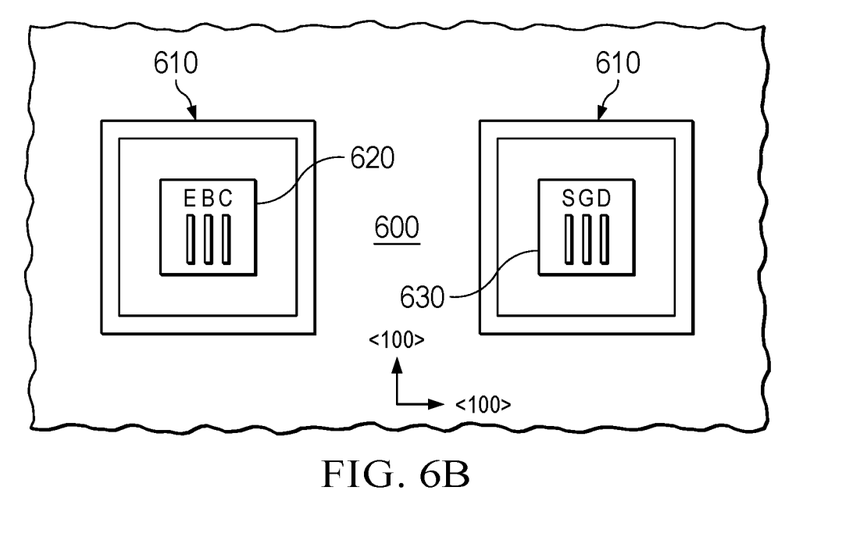
FIGS. 6B and 6C illustrate example bipolar transistors of the disclosure with isolation trenches oriented parallel with a <110> direction of the production substrate of FIG. 6A.
Figure 6C:
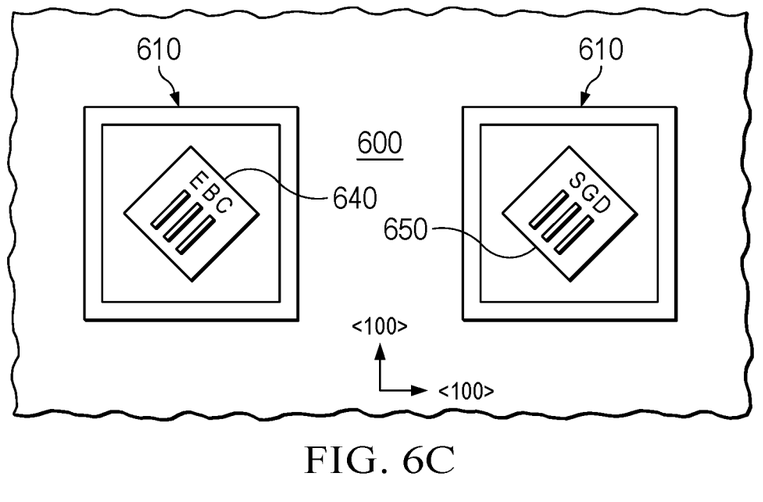

FIGS. 6A-6C illustrate examples of the disclosure that are implemented on a <100> production substrate 600. FIG. 6A illustrates the orientation of the <100> directions and the <110> directions of the substrate 600. FIGS. 6B and 6C show a deep trench 610 that has the form of a polygon, in these examples a square, with sides extending along a <100> direction of the substrate 600. In FIG. 6B in a first example the deep trench 610 surrounds a bipolar transistor 620 that has EBC strips that also extend along a <100> direction of the substrate 600. The orientation of the deep trench 600 with respect to the transistor 620 is in contrast to known conventional implementations, in which bipolar transistors are formed on a <110> production substrate, and thus in such implementations sides of the deep trench also extend along a <110> direction of the production substrate. In a second example the deep trench surrounds a MOS transistor 630 portrayed as S (source), G (gate) and D (drain) strips (briefly, "SGD strips") that extend along the <100> direction of the substrate 600. In some examples the EBC strips or SGD strips extend along a direction different than the deep trench 610, and in general the orientation of the transistor 620 may be arbitrary with respect to the lattice of the substrate 600. In one such example FIG. 6C shows the deep trench 610 surrounding a bipolar transistor 640 that has EBC strips that extend along a <110> direction of the substrate 600. Similarly, a MOS transistor 650 has EBC SGD strips that extend along a <110> direction.

Figure 7A:
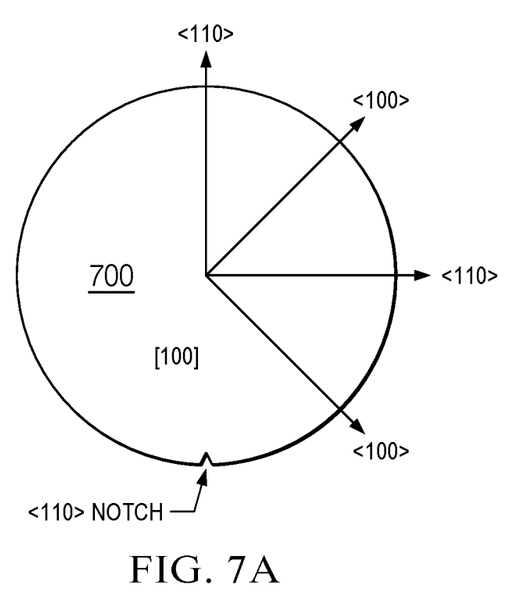
FIG. 7A illustrates a <110> production substrate with representative lattice directions.
Figure 7B:
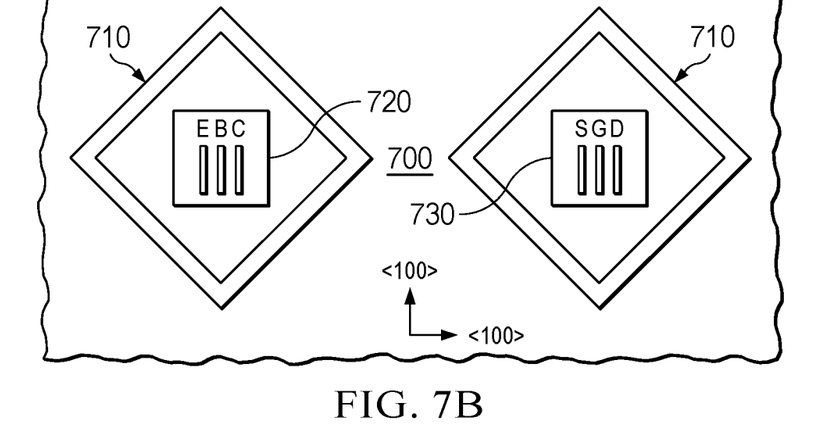
FIGS. 7B and 7C illustrate example bipolar transistors of the disclosure with isolation trenches oriented parallel with a <110> direction of the production substrate of FIG. 7A.
Figure 7C:
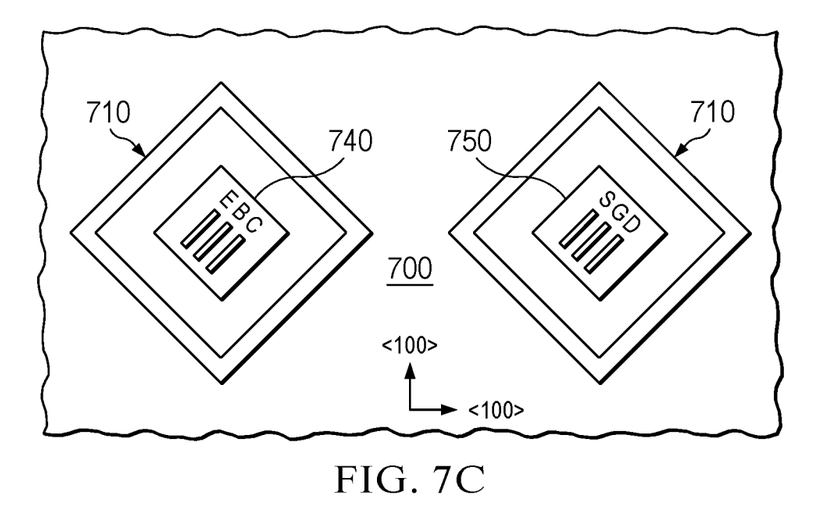

The disclosed recognition may be generalized to semiconductor substrates other than <100> wafers. FIGS. 7A-7C illustrate examples of the disclosure that are implemented on a <110> production substrate 700. FIG. 7A illustrates the orientation of the <100> directions and the <110> directions of the substrate 700, which are seen to be rotated 45° clockwise with respect to the substrate 600. FIGS. 7B and 7C show a deep trench 710 with sides extending along a <100> direction of the substrate 700. FIG. 7B shows the deep trench 710 surrounding a bipolar transistor 720 that has EBC strips extending along a <110> direction of the substrate 700, e.g. rotated 45° with respect to the sides of the deep trench 710. In another example the deep trench 710 surrounds a MOS transistor 730 with SGD strips extending along a <110> direction of the substrate. Such examples may provide the benefit of enhanced hole mobility of a <110> channel direction of the transistor 730, and the benefit of reduced dislocation defects that could otherwise occur if the sides of the deep trench were also aligned with the <110> direction. In further examples FIG. 7C shows the deep trench 710 surrounding a bipolar transistor 740 that has EBC strips that extend along a <100> direction of the substrate 700, or parallel to two sides of the deep trench 710. FIG. 7C also shows the deep trench 710 surrounding a MOS transistor 750 that has SGD strips that extend along a <100> direction of the substrate 700. In general the orientation of the transistors may be arbitrary with respect to the sides of the deep trench 710.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An integrated circuit, comprising:
    a bipolar transistor extending into a [100] surface of a semiconductor substrate having a crystalline lattice; and
    a deep trench surrounding the bipolar transistor with a path having a plurality of sides, at least one side extending in a direction parallel to a <100> axis of the crystalline lattice,
    wherein the bipolar transistor has an emitter strip, a base strip or a collector strip extending in a direction parallel to a <110> axis of the crystalline lattice.

2. The integrated circuit of claim 1, wherein the path has four sides each extending in a path parallel to a <100> or equivalent axis of the crystalline lattice.

3. The integrated circuit of claim 1, wherein the semiconductor substrate is a silicon substrate.

4. The integrated circuit of claim 1, wherein the deep trench extends through a first semiconductor layer having a first dopant concentration to a doped buried layer having a greater second dopant concentration.

5. The integrated circuit of claim 4, wherein the first semiconductor layer has a first conductivity type and the doped buried layer has a different second conductivity type.

6. The integrated circuit of claim 4, wherein the first semiconductor layer and the doped buried layer are N-type.

7. The integrated circuit of claim 1, wherein the deep trench is filled with polysilicon.

8. The integrated circuit of claim 1, further comprising a MOS transistor surrounded by a second deep trench, the second deep trench having at least one side extending in a direction parallel to the <110> axis of the crystalline lattice.

9. The integrated circuit of claim 1, wherein the deep trench has a depth of at least 5 μm.

10. A method of forming an integrated circuit, comprising:
    forming a bipolar transistor extending into a [100] face of a semiconductor substrate having a crystalline lattice; and
    forming a deep trench surrounding the bipolar transistor, the deep trench having a path with a plurality of sides, at least one side extending in a direction parallel to a <100> axis of the crystalline lattice,
    wherein the bipolar transistor has an emitter strip, a base strip or a collector strip extending in a direction parallel to a <110> axis of the crystalline lattice.

11. The method of claim 10, wherein the path has four sides each extending in a path parallel to a <100> or equivalent axis of the crystalline lattice.

12. The method of claim 10, wherein the semiconductor substrate is a silicon substrate.

13. The method of claim 10, wherein the deep trench extends through a first semiconductor layer having a first dopant concentration to a doped buried layer having a greater second dopant concentration.

14. The method of claim 13, wherein the first semiconductor layer has a first conductivity type and the doped buried layer has a different second conductivity type.

15. The method of claim 13, wherein the first semiconductor layer and the doped buried layer are N-type.

16. The method of claim 10, wherein the deep trench is filled with polysilicon.

17. The method of claim 10, further comprising forming a second deep trench surrounding a MOS transistor, the second deep trench having at least one side extending in a direction parallel to the <110> axis of the crystalline lattice.

18. The method of claim 10, wherein the deep trench has a depth of at least 5 μm.

19. An integrated circuit, comprising:
- a transistor extending into a [100] surface of a semiconductor substrate having a crystalline lattice; and
- a deep trench surrounding the transistor with a path having a plurality of sides, at least one side extending in a direction parallel to a <100> axis of the crystalline lattice,
- wherein the transistor has a gate strip or a base strip extending in a direction parallel to a different axis of the crystalline lattice.

20. The integrated circuit of claim 19, wherein the transistor is a bipolar transistor and includes an emitter strip or a collector strip extending in a direction parallel to a <110> axis of the crystalline lattice.

* * * * *